(12) United States Patent
Fang et al.

(10) Patent No.: US 8,538,221 B1
(45) Date of Patent: Sep. 17, 2013

(54) ASYMMETRIC HYBRID PHOTONIC DEVICES

(75) Inventors: Alexander W. Fang, Fremont, CA (US); Gregory Fish, Santa Barbara, CA (US)

(73) Assignee: Aurrion, LLC, Santa Barbara, CA (US)

( * ) Notice: Subject to any disclaimer, the term of this patent is extended or adjusted under 35 U.S.C. 154(b) by 21 days.

(21) Appl. No.: 13/099,748

(22) Filed: May 3, 2011

Related U.S. Application Data

(63) Continuation of application No. 12/774,531, filed on May 5, 2010, now abandoned.

(51) Int. Cl.
*G02B 6/10* (2006.01)

(52) U.S. Cl.
USPC .................................. 385/129; 385/2; 385/14

(58) Field of Classification Search
USPC .................. 385/14, 15, 2, 129; 372/81, 50.1, 372/46.01, 43.01, 75
See application file for complete search history.

(56) References Cited

U.S. PATENT DOCUMENTS

| | | |
|---|---|---|
| 6,845,198 B2 | 1/2005 | Montgomery et al. |
| 7,408,693 B2 | 8/2008 | Kissa et al. |
| 2006/0239308 A1 * | 10/2006 | Husain et al. ............ 372/29.013 |
| 2007/0170417 A1 | 7/2007 | Bowers |
| 2007/0291808 A1 * | 12/2007 | Ledentsov et al. ......... 372/50.11 |
| 2008/0002929 A1 | 1/2008 | Bowers et al. |
| 2009/0254298 A1 | 10/2009 | Harke |
| 2010/0020837 A1 | 1/2010 | Gan |

* cited by examiner

*Primary Examiner* — Ellen Kim
(74) *Attorney, Agent, or Firm* — Blakely Sokoloff Taylor & Zafman, LLP

(57) ABSTRACT

Optical devices having a first semiconductor slab including a first lateral boundary for an optical mode and a second semiconductor slab above and asymmetrically overlapping the first lateral boundary included in the first semiconductor slab and including an edge of a second lateral boundary for the optical mode. The second lateral boundary is disposed above and to a side of the first lateral boundary. The first semiconductor slab is of a silicon material while the second semiconductor slab is of a III-V material. A first and a second electrical contact are coupled to the second semiconductor slab, one on each lateral side of the second lateral boundary.

The optical device further includes an optical waveguide region formed by the first and second lateral optical mode boundaries, wherein a complex refractive index of the optical waveguide region changes based on an electrical difference applied between the first and second electrical contacts.

17 Claims, 4 Drawing Sheets

ASYMMETRIC HYBRID PHOTONIC DEVICES

This application is a continuation of pending U.S. patent application Ser. No. 12/774,531 filed May 5, 2010 now abandoned and claims priority thereto.

FIELD

Embodiments of the invention generally pertain to photonic circuits, and more particularly to optical mode confinement for hybrid photonic devices comprising silicon and III-V semiconductor material.

BACKGROUND

Semiconductor photonic devices, such as lasers, have an active structure in which electrons and holes are converted into photons to produce optical emissions. FIG. 1 illustrates a cross-sectional view of prior art semiconductor laser 100. When a positive electrode is connected to p-type electrical contact 110 and negative electrodes are connected to n-type electrical contacts 120 and 125, and a voltage is applied, laser 100 becomes forward biased. Electrical current (i.e., holes and electrons) is injected towards active layer 130. Holes in p-type region 102 move in a direction away from p-type electrical contact 110 toward n-type electrical contacts 120 and 125; electrons in relatively thin n-type layer 160 move in a direction away from n-type contacts 120 and 125 toward p-type electrical contact 110. It will be understood that the active structure of laser 100 includes optical mode 135 and active region 190, which is a portion of active layer 130 included in optical mode 135. As the holes and electrons meet at active region 190, the holes and electrons combine to emit light.

Prior art laser 100 also includes current confinement structures 153-154 that serve to channel the injected current towards active region 190, and optical confinement structures 151-152 to form optical mode 135. These confinement structures increase light conversion efficiency by reducing the amount of current injected into areas of active layer 130 where the resulting light produced is not guided within optical mode 135. Optical mode confinement structures in prior art laser 100 are thus necessary in substrate region 101 (structures 151 and 152, along with layer 170) and current confinement structures are necessary within the p-type region 102 (structures 153 and 154).

Optical confinement structures 151 and 152 may be selectively oxidized or etched portions of substrate region 101. These confinement structures do not conduct current, and thus cause the current to be channeled towards active region 190 along relatively thin n-type layer 160. The width of optical confinement structures 151 and 152 is dictated by the desire to reduce the loss of light transmitted outside optical mode 135 due to leakage of light through the confinement structure.

P-type region confinement structure 153 and 154 may be regions bombarded or implanted with protons. This implantation makes structures 153 and 154 semi-insulating, which ensures that holes will not pass through these areas, but will be channeled between them and towards active region 190. Structures 153 and 154 must be a certain distance from active region 190 to eliminate the possibility of implant damage that will cause some of the injected current to spread and leak outside of the confined area. This distance required between said confinement structures and active region 190 reduces current injection efficiency as regions of active layer 130 that do not overlap optical mode 135 produce light not emitted into the optical mode.

The above confinement structure creation techniques further result in the device having poor thermal performance due to material loss where the material was etched away to form structures 151 and 152. The areas that heat may dissipate away from active region 190 are restricted due to structures 151 and 152 and layer 170. Prior art solutions to improve thermal performance have included creating thermal shunts in a lasing device, but this solution requires additional processing steps.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

Descriptions of certain details and implementations follow, including a description of the figures, which may depict some or all of the embodiments described below, as well as discussing other potential embodiments or implementations of the inventive concepts presented herein. An overview of embodiments of the invention is provided below, followed by a more detailed description with reference to the drawings.

DETAILED DESCRIPTION

Embodiments of the present invention relate to an electro-optic device comprising a first region of silicon semiconductor material and a second region of III-V semiconductor material. A waveguide of the optical device is formed in part by asymmetrically disposing the first and second regions in an offset fashion to create lateral optical confinement.

III-V semiconductor materials have elements that are found in group III and group V of the periodic table (e.g., Indium Gallium Arsenide Phosphide (InGaAsP), Gallium Indium Arsenide Nitride (GaInAsN)). The carrier dispersion effects of III-V based materials may be significantly higher than in silicon based materials for bandgaps closer to the wavelength of the light being transmitted, as electron speed in III-V semiconductors is much faster than that in silicon. In addition, III-V materials have a direct bandgap which is required for the most efficient creation of light from electrical pumping. Thus, III-V semiconductor materials enable photonic operations with an increased efficiency over silicon for both generating light and modulating the refractive index of light.

The first and second regions of the electro-optic device may overlap in an offset fashion. It will be understood in view of the figures and description below that this novel geometry, combined with the reduced number of optical waveguide boundaries compared to the prior art, decreases the size, or "footprint," necessary for a device to include an optical waveguide of a given length. It will be further understood that the novel geometry, combined with the reduced number of optical waveguide boundaries compared to the prior art, reduces the resistance of an optical device by allowing an n-type electrical contact to be closer to an active region.

Figure 2:
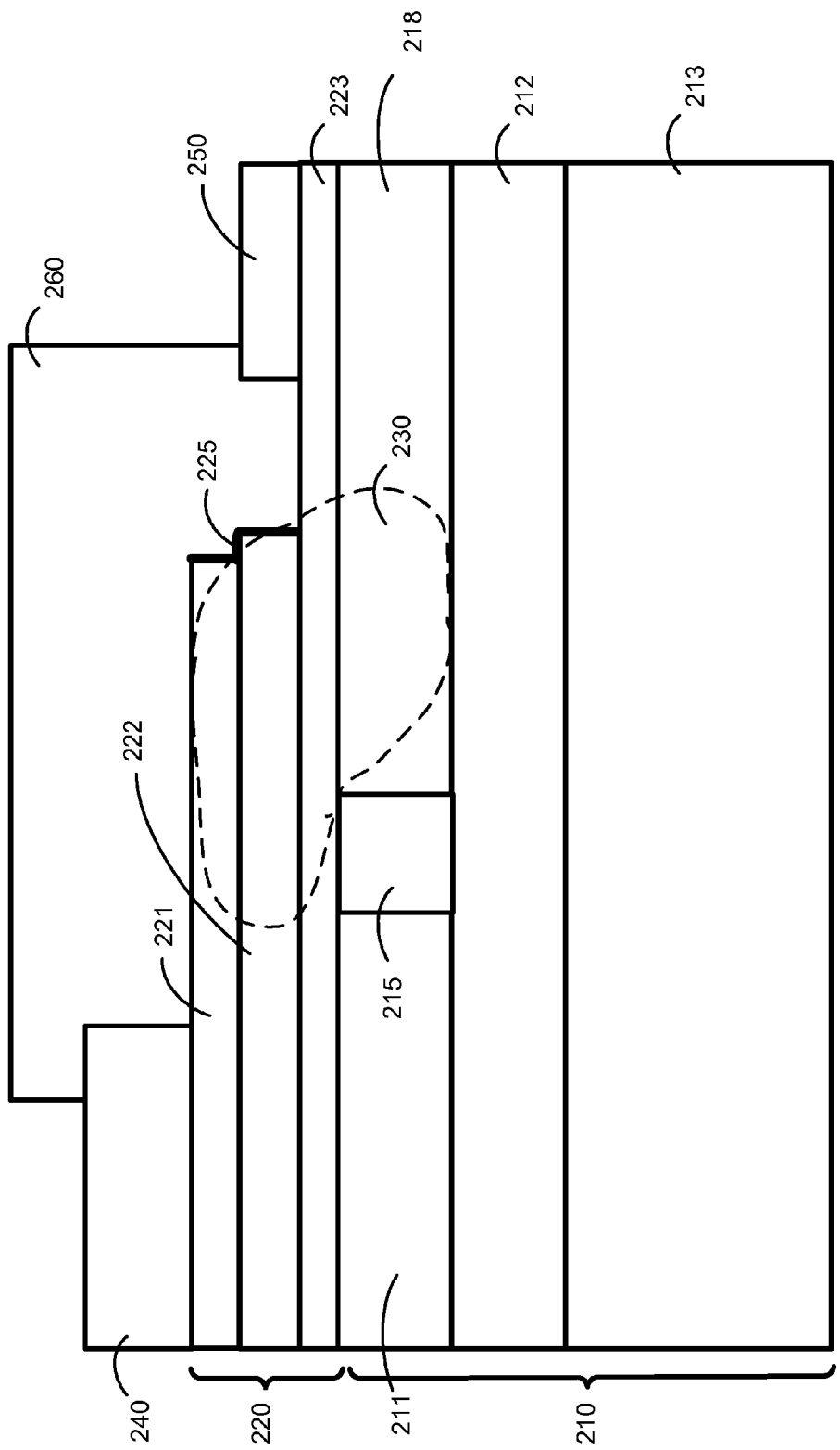
FIG. 2 is a block diagram of an asymmetric hybrid gain structure according to an embodiment of the invention.

FIG. 2 is a block diagram of an optical gain (i.e. amplification) structure according to an embodiment of the invention. It is to be understood that there exist various processing techniques that may be used to form the device as shown. Accordingly, the inventive structure may be formed using any acceptable process sequence that yields the various device elements, element positions and associated doping levels required for acceptable operation.

Gain structure 200 includes silicon semiconductor slab 210 and III-V semiconductor slab 220. Silicon semiconductor slab 210 includes silicon top layers 211 and 218, silicon dioxide layer 212 and silicon substrate layer 213 disposed below the dioxide layer. Silicon semiconductor slab 210 further includes optical mode lateral boundary 215.

Optical mode lateral boundary 215 is illustrated to be a single etch. It is to be understood that optical mode lateral boundary 215 may be any region that creates "a void of light" between layers 211 and 218. In one embodiment, optical mode lateral boundary 215 reduces the index of refraction of boundary 215 with respect to layers 211 and 218. For example, boundary 215 may be an oxidized portion of lower slab 210, a broad band optical grating, or any similar structure. In alternative embodiments, optical mode lateral boundary 215 may be an anti-resonant structure. For example, optical mode lateral boundary may be a photonic bandgap structure (e.g., a photonic crystal). Thus, optical mode lateral boundary 215 may be any functional equivalent of an optical boundary known in the art.

III-V semiconductor slab 220 includes p-type layer 221, active region 222 and n-type layer 223 coupled to silicon layers 211 and 218. The term "p-type layer," as used herein, describes a layer comprising a material that has more positive carriers (i.e., holes) than negative carriers (i.e., electrons). The term "n-type layer," as used herein, describes a layer comprising a material that has more negative carriers than positive carriers. In the illustrated embodiment, layers 221 and 222 are etched in a manner to form optical mode lateral boundary 225—in FIG. 2, optical mode lateral boundary 225 is an edge of III-V semiconductor slab 220 that is "bolded" or "thicker" for illustrative purposes only.

In an alternative embodiment, layer 221 may be an n-type layer, and layer 223 may be a p-type layer. In another alternative embodiment, layers 221 and 223 may be n-type layers, while active region 222 may include a tunnel junction to convert n-type majority carriers to p-type majority carriers. This alternative embodiment avoids the associated optical and microwave loss of p-type materials due to the use of p-dopants.

Figure 1:
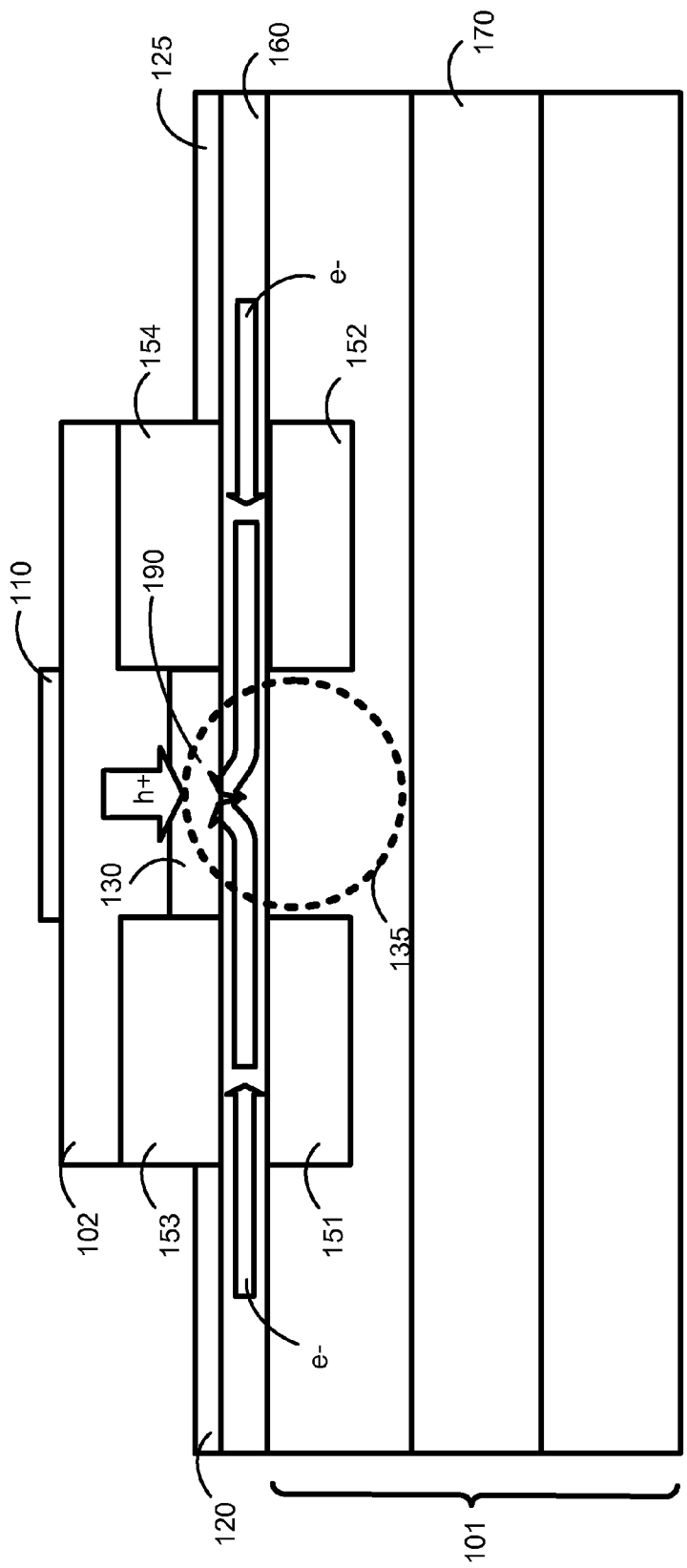
FIG. 1 is a block diagram of a prior art semiconductor laser.

III-V semiconductor layer 220 is disposed above silicon semiconductor slab to asymmetrically overlap lateral optical mode boundary 215. Boundaries 215 and 225 are the only boundaries required to laterally confine optical mode 230. Therefore, in the illustrated embodiment, gain structure 200 includes fewer lateral optical mode boundaries (i.e., boundaries 215 and 225) in layers 210 and 220 compared to the prior art optical device of FIG. 1. It will be understood that the removal of the optical mode boundaries reduces the thermal and electrical resistance of the device as these regions are also boundaries to current and heat flow. It will also be understood that the reduced number of optical mode boundaries enables a decrease in the device size/footprint necessary for a device to include an optical waveguide of a given length.

Furthermore optical mode boundaries 215 and 225 require no proton implant through or close to the active region, thereby reducing potential reliability problems (in the prior art, proton implanted regions cannot be too near to the active region due to concerns about implant damage causing current to spread and leak outside of the confined area). Non-implantation techniques allow for more precise control over the size and location of optical mode boundaries 215 and 225, as implantation precision (e.g., 500 nm) is less precise than, for example, lithographic precision (e.g., 50 nm).

It will be understood in view of the illustrated embodiment that because lateral optical mode boundary 225 is not the result of proton implantation, there is no separation required to account for implant damage between the optical mode boundary and active region 222. Thus, embodiments of the invention allow for more efficient carrier injection and a higher optical gain due to the increased overlap between the optical mode and injected current (i.e., more of the injected current is within the optical mode).

Gain structure 200 may further include vertical optical mode confinement layer 260. Vertical optical mode confinement layer 260 may be any material with a refractive index lower than that of III-V slab 220 (e.g., confinement layer 260 may comprise silicon dioxide). Vertical optical mode confinement layer 260 and silicon dioxide layer 212 vertically confine optical mode 230. It will be understood that varying the thickness of layers 212 and 260 may vary the vertical size of optical mode 230 and thus vary the size of the optical waveguide that supports optical mode 230.

Gain structure 200 further includes electrode 240 coupled to p-type layer 221 and on one side of lateral optical mode boundary 225, and electrode 250 coupled to n-type layer 223 and on the opposite side of lateral optical mode boundary 225. The complex refractive index (i.e., at least one of the real and the imaginary refractive index) of at least the portion of active region 222 included in optical mode 230 changes based on an electrical difference (e.g., electrical voltage, electrical field) applied to electrodes 240 and 250. The electrical difference may forward bias gain structure 200, thus producing an optical gain within optical mode 230. These changes to the refractive index (or indexes) are proportional to the strength of the electrical difference applied to electrodes 240 and 250.

It will be further understood that having only one lateral optical boundary in III-V slab 220 allows for a greater overlap between p-type layer 221 and electrode 240, thus improving ohmic contacts to p-type layer 221 with lower resistance. Thus, a lower overall resistance is provided when injecting current into the current injection path (i.e., the path between electrodes 240 and 250) of gain structure 200.

It will be understood that a structure with the same or similar geometric aspects, optical boundaries and configuration of semiconductor layers as FIG. 2 may be used to modulate or detect light transmitted through the optical waveguide of the structure by applying an electrical difference to reverse bias the structure. Therefore, the structure illustrated in FIG. 2 may be used for a modulator and for a photodetector.

Figure 3:
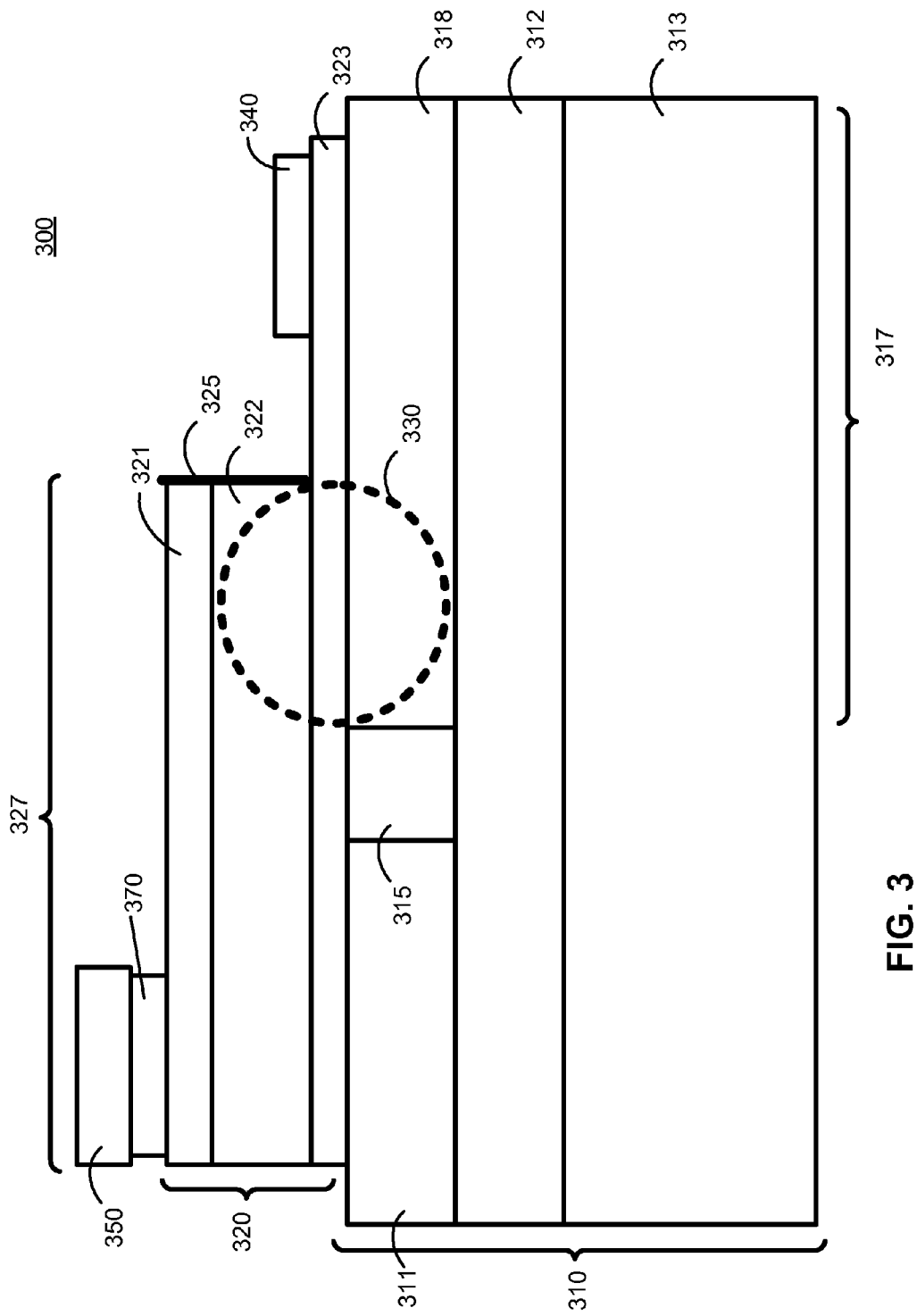
FIG. 3 is a block diagram of an asymmetric hybrid modulator according to an embodiment of the invention.

FIG. 3 is a block diagram of a modulating structure according to an embodiment of the invention. Modulator 300 includes lower silicon semiconductor slab 310 and upper III-V semiconductor slab 320. In this embodiment, Silicon on Insulator (SOI) wafer 310 includes silicon regions 311 and 318, silicon dioxide region 312 and silicon substrate 313 disposed below the dioxide region. Silicon slab 310 may further include etched trench 315. Trench 315 is etched to define lower slab region 311 to partially guide optical mode 330 and to form a barrier for the conduction of charge along silicon slab 310. In other embodiments, instead of trench 315, silicon slab 310 may include any area having a lower effective refractive index, or any anti-resonant structure known in the art.

III-V semiconductor slab 320 includes upper slab region 327. This region may be shaped by etching away material to confine the conduction of electrical charge within upper slab region 327. In one embodiment, upper slab region is further shaped to form an optical boundary—i.e., edge 325 of upper slab 320, for an optical waveguide that supports optical mode 330 (in FIG. 3, edge 325 is "bolded" or "thicker" for illustrative purposes only).

Thus, optical mode 330 is included at least where upper slab region 327 overlies lower slab region 317. The optical waveguide that supports optical mode 330 is horizontally confined by trench 315 and edge 325, and vertically confined by silicon dioxide layer 312 and cladding layer 321 (described below).

FIG. 3 illustrates upper slab region 327 above and overlapping lower slab region 317 asymmetrically with respect to lateral optical mode boundary 315. This geometry provides an optical mode barrier in each of III-V semiconductor slab 320 (i.e., edge 325) and silicon slab 310 (i.e., trench 315).

In one embodiment, contact layer 370 is disposed between electrode 350 and upper slab region 327. Contact layer 370 is utilized to facilitate the creation of ohmic contacts to upper slab region 327 under electrode 350. To prevent unwanted optical loss during modulation, contact layer 370 should be formed to be an appropriate distance from the proximity of optical mode 330. Contact layer 370 may comprise Indium Gallium Arsenide (InGaAs) or other similar semiconductor material with superior electron velocity with respect to upper slab region 327.

Active layer 322 is of a III-V semiconductor with high electro-optic efficiency—i.e., the absorption coefficient (i.e., the imaginary portion of the complex refractive index) and the refractive index (i.e., the real portion of the complex refractive index) of active layer 322 is easily affected by either the Franz Kheldysh effect if active layer 322 comprises bulk material (e.g., intrinsic Indium Gallium Arsenide Phosphide (i-InGaAsP) or Indium Aluminum Gallium Arsenide (InAlGaAs)) or the Quantum Confined Stark Effect (QCSE) if active layer 322 comprises multiple quantum wells (MQW).

Cladding layer 321 is of a material that has a bandgap greater than electro-optically efficient active layer 322 and contact layer 370. Thus, cladding layer 321 ensures an electric field is formed across active layer 322 and contact layer 370 if those layers are doped to facilitate the formation of ohmic contacts. In one embodiment, cladding layer 321 is of p-doped Indium Phosphide (P InP), and layer 323 is of n-doped Indium Phosphide (N InP).

Modulator 300 further includes electrode 340, coupled to n-type layer 323 and disposed on one side of lateral optical mode boundary 325, and electrode 350, disposed on the opposite side of lateral optical mode boundary 325. The complex refractive index (i.e., at least one of the real and imaginary refractive indexes) of the waveguide that supports optical mode 330 changes based on an electrical difference (e.g., electrical voltage, electrical field) applied to electrodes 340 and 350 to reverse bias modulator 300. The application of the electrical difference thus modulates light transmitted through the waveguide. These changes to the complex refractive index are proportional to the strength of the electrical difference applied to electrodes 340 and 350. It is to be understood that, in this embodiment, the overlapping silicon region 318 included in optical mode 330 does not actively modulate light.

Figure 4:
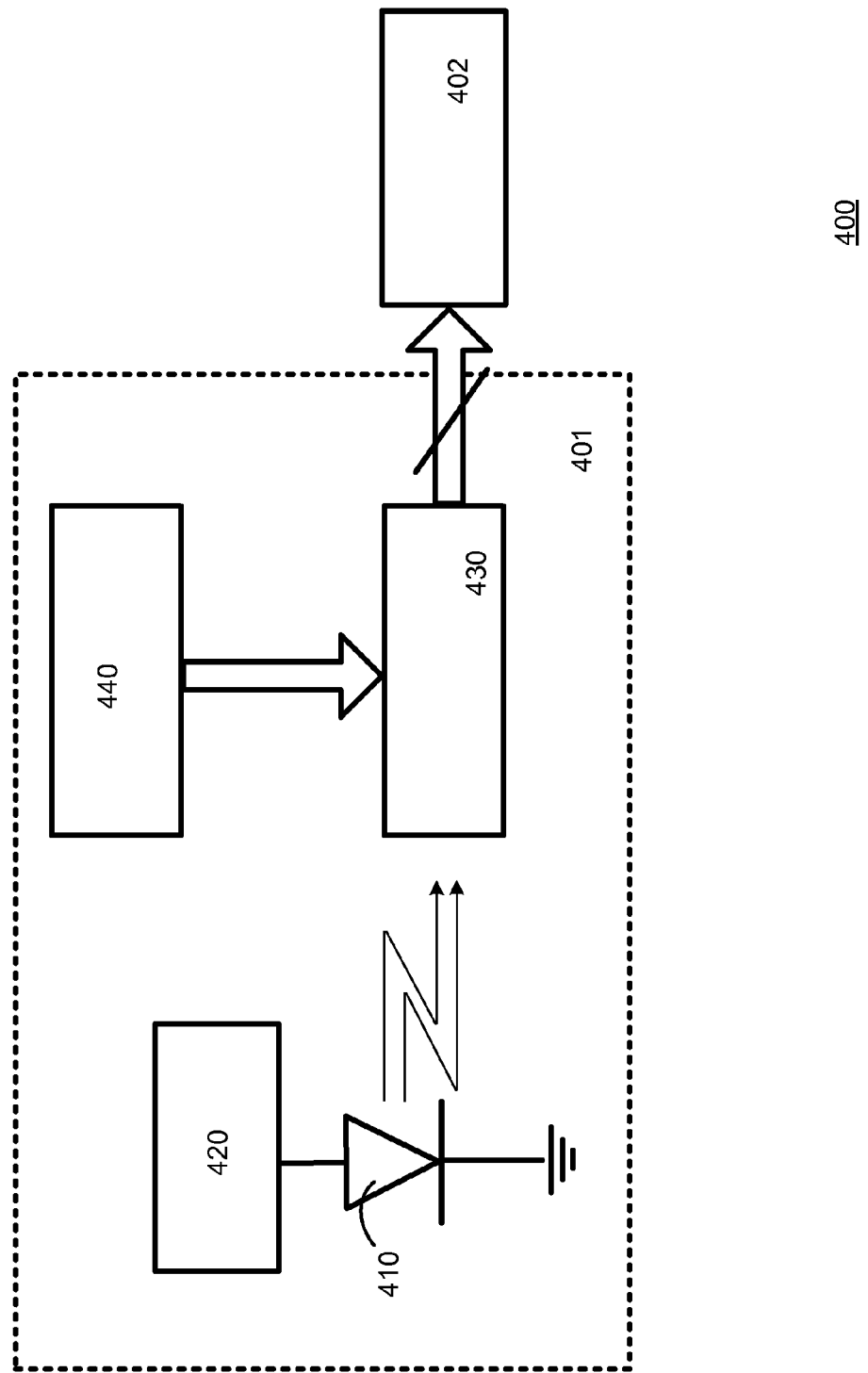
FIG. 4 is a block diagram of a simplified optical system utilizing embodiments of the invention.

FIG. 4 is a block diagram of a simplified optical system utilizing an embodiment of the invention. System 400 includes transmitter 401 and receiver 402. Transmitter 401 includes light source 410 and light source controller 420. In the illustrated embodiment, light source 420 is a laser utilizing a hybrid active gain structure comprising any embodiment of the invention described above. Light source controller 420 may control the hybrid active gain structure of light source 410 (i.e., light source controller 420 may create an electrical difference at electrical contacts of light source 410). In one embodiment, light source controller 420 comprises silicon circuitry while light source 410 comprises III-V and silicon semiconductor material. Light source 410 may transmit optical signals to modulator 430 via any transmission medium known in the art.

Modulator 430 may comprise any hybrid modulating structure described above. Modulator 430 may perform either amplitude or phase modulation of the light received from light source 410. In one embodiment, optical waveguides of modulator 430 are controlled by modulator controller 440 (i.e., modulator controller 440 may create an electrical difference at electrical contacts of modulator 430). The modulated output of modulator 430 may be transmitted to receiver 402 via any transmission medium known in the art.

As described above, modulator 430 may comprise silicon and III-V semiconductor material. In one embodiment, system 400 is included in a single device or chip, wherein silicon components of system 400 are included on a silicon portion of the chip, and III-V semiconductor components of system 400 are included on a III-V portion of the chip. These portions may be fabricated independently and subsequently bonded via any bonding process known in the art.

Reference throughout the foregoing specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout the specification are not necessarily all referring to the same embodiment. Furthermore, the particular features, structures or characteristics may be combined in any suitable manner in one or more embodiments. In addition, it is appreciated that the figures provided are for explanation purposes to persons ordinarily skilled in the art and that the drawings are not necessarily drawn to scale. It is to be understood that the various regions, layers and structures of figures may vary in size and dimensions.

In the foregoing detailed description, the method and apparatus of the present invention have been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive.

The invention claimed is:

1. An apparatus comprising:
    a first semiconductor slab including a first lateral boundary for an optical mode, the first semiconductor slab comprising a silicon material;
    a second semiconductor slab disposed above and the first lateral boundary included in the first semiconductor slab to asymmetrically overlap, the second semiconductor slab comprising a III-V material and including an active layer extending to an exterior edge of the second semiconductor slab, the exterior edge to form a second lateral boundary for the optical mode, the second lateral boundary disposed above and to a side of the first lateral boundary;

a first and a second electrical contact coupled to the second semiconductor slab, one on each lateral side of the second lateral boundary; and an optical waveguide region included in the overlap of the first semiconductor slab and the second semiconductor slab, the optical waveguide region formed by the first and second lateral optical mode boundaries, wherein real and imaginary portions of a refractive index of optical waveguide region changes based on an electrical field generated by an electrical difference applied between the first and second electrical contacts.

2. The apparatus of claim 1, the first lateral boundary included in the first semiconductor slab comprises an area having an effective refractive index lower than the silicon material.

3. The apparatus of claim 1, wherein the first lateral boundary included in the first semiconductor slab comprises an anti-resonant structure.

4. The apparatus of claim 1, further comprising
a silicon substrate layer below the first semiconductor slab;
a first vertical confinement layer to confine the optical mode, the first vertical confinement layer disposed between the first semiconductor slab and the silicon substrate layer; and
a second vertical confinement layer to confine the optical mode, the second vertical confinement layer disposed above the second semiconductor slab.

5. The apparatus of claim 4, wherein the first vertical confinement layer and the second vertical confinement layer each comprise silicon dioxide.

6. The apparatus of claim 1, wherein the electrical difference applied between the first and second electrical contacts comprises an electrical field and the apparatus further includes
a current injection path at least partially included in the optical waveguide, the current injection path to be responsive to the electrical field to produce optical gain in the optical transmission region.

7. The apparatus of claim 6, wherein the second semiconductor slab comprises a first layer, a second layer, the active layer disposed between the first and second layer, and wherein the first layer and the active layer are etched to form the second lateral boundary for the optical mode.

8. The apparatus of claim 7, wherein the first layer comprises a p-type material and the second layer comprises an n-type material.

9. The apparatus of claim 7, wherein the first layer comprises an n-type material and the second layer comprises a p-type material.

10. The apparatus of claim 7, wherein the first and second layers each comprise an n-type material and the active layer includes a tunnel junction to convert n-type majority carriers of the first layer to p-type majority carriers.

11. The apparatus of claim 1, further comprising
an active region included in the active layer of the second semiconductor slab portion of the optical transmission region, wherein the active region is responsive to the electrical difference applied between the first and second electrical contact to modulate the phase or amplitude of light transmitted via the optical waveguide region.

12. The apparatus of claim 11 further comprising a contact layer formed between the second semiconductor slab and the second electrical contact to enhance creation of ohmic contacts below the second electrical contact in a region of the second semiconductor region.

13. The apparatus of claim 12, wherein the contact layer comprises p-type Indium Gallium Arsenide (p-InGaAs).

14. The apparatus of claim 12, wherein the second semiconductor slab further comprises
a cladding layer below the contact layer, the cladding layer to confine the optical mode;
and
an N-type layer between the active layer and the first semiconductor slab.

15. The apparatus of claim 14, wherein the cladding layer comprises P-doped Indium Phosphide (P InP), and the N-type layer comprises N-doped Indium Phosphide (P InP).

16. The apparatus of claim 14, wherein the active layer comprises at least one of intrinsic Indium Gallium Arsenide Phosphide (i-InGaAsP) and Indium Aluminum Gallium Arsenide (InAlGaAs).

17. The apparatus of claim 14, wherein the active layer comprises a multiple quantum well (MQW) layer.

\* \* \* \* \*